SINGLE CRYSTAL PHOTOVOLTAIC CELL

Filed Dec. 30, 1958 2 Sheets-Sheet 1

INVENTOR
GEORGE CHEROFF

BY William J. Schelberg
AGENT

May 30, 1961 G. CHEROFF 2,986,644

SINGLE CRYSTAL PHOTOVOLTAIC CELL

Filed Dec. 30, 1958 2 Sheets-Sheet 2

United States Patent Office 2,986,644 Patented May 30, 1961

2,986,644

SINGLE CRYSTAL PHOTOVOLTAIC CELL

George Cheroff, Poughkeepsie, N.Y., assignor to International Business Machines Corporation, New York, N.Y., a corporation of New York Filed Dec. 30, 1958, Ser. No. 783,924

2 Claims. (Cl. 250—225)

This invention relates to a polarization sensitive photovoltaic device and more particularly to a single crystal photovoltaic cell which is responsive to the angle at which linearly polarized light is incident upon the crystal.

In a copending application, Serial No. 746,682, filed July 7, 1958, by the same applicant, and assigned to the same assignee as this invention, it was revealed that certain light-sensitive materials exhibit unique and useful photovoltaic effects. In particular, the photovoltages exhibited by these materials were found to be of positive or negative polarity, depending upon the particular wave length and intensity of the incident natural light radiation. In addition, in this application, novel photovoltaic elements and logical circuits were described.

The present invention is based upon a discovery that a polarization sensitive photovoltaic device may be made using certain single crystals of light responsive materials which exhibit this photovoltaic effect. Furthermore, the sign and magnitude of the photovoltages obtained from this device may be varied by changing the angle at which a plane of linearly polarized light radiation strikes a polar axis of the crystal.

Accordingly, an object of this invention is to provide a new and useful photovoltaic device particularly adapted to respond to linearly polarized light.

A more specific object is to provide a polarization sensitive single crystal photovoltaic element whose photovoltages depend upon the angle at which a linearly polarized light input is incident upon the polar axis of the crystal.

Other objects of the invention will be pointed out in the following description and claims and illustrated in the accompanying drawings, which disclose, by way of example, the principle of the invention and the best mode, which has been contemplated of applying that principle.

Figure 1:
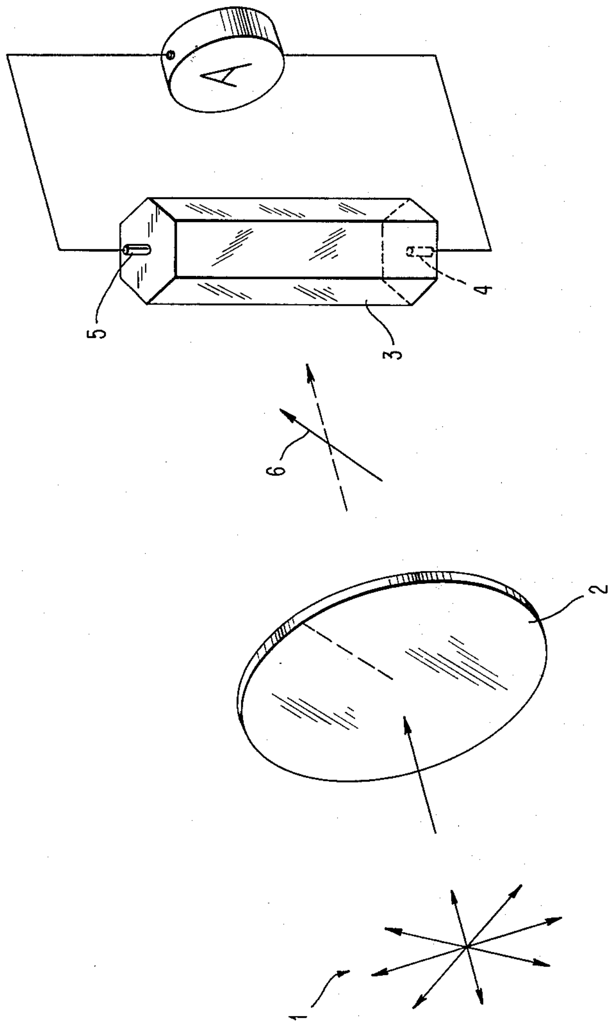
Figure 1 is a schematic representation of the polarization sensitive photovoltaic device of the present invention.

In accordance with the present invention, Figure 1 shows apparatus depicting the unique polarization sensitive photovoltaic device, comprising a natural light source 1, a polarizer 2, a single crystal photovoltaic material 3, electrodes 4 and 5 and a suitable recording instrument, such as ammeter A. In operation a natural light radiation source is allowed to be incident upon the polarizer, which transmits only linear light. The polarizer may be a Nicol prism, or a sheet of Polaroid. The dotted line across the polarizer indicates the direction of the electric vector in the transmitted light and corresponds to the arrow shown as 6. The transmitted light falls on the photovoltaic cell and the impressed photovoltage passes through electrodes 4 and 5 and the resultant current recorded in ammeter A. The polarizer may be rotated to vary the angle at which the linearly polarized light strikes the photovoltaic crystal.

The single crystal material according to the present invention is distinguished by the following characteristics. The material exhibits a photovoltaic effect as described in detail in the aforementioned copending application. Furthermore, it is observed that suitable single crystal material possesses in its crystal structure a polar symmetry axis, such as the C-axis of hexagonal ZnS and hexagonal CdS. These materials may be grown by a sublimation technique in which the crystals grow from the vapor phase and deposit in a cool region. In this manner both inactivated and activated single crystals may be prepared in rather high purity. For zinc sulfide the single crystal is hexagonal with lengths of between 2 and 10 mm. and thicknesses in the range of 1 mm. The long axis of the cylinder or C-axis is the polar axis of the crystal.

Figure 2:
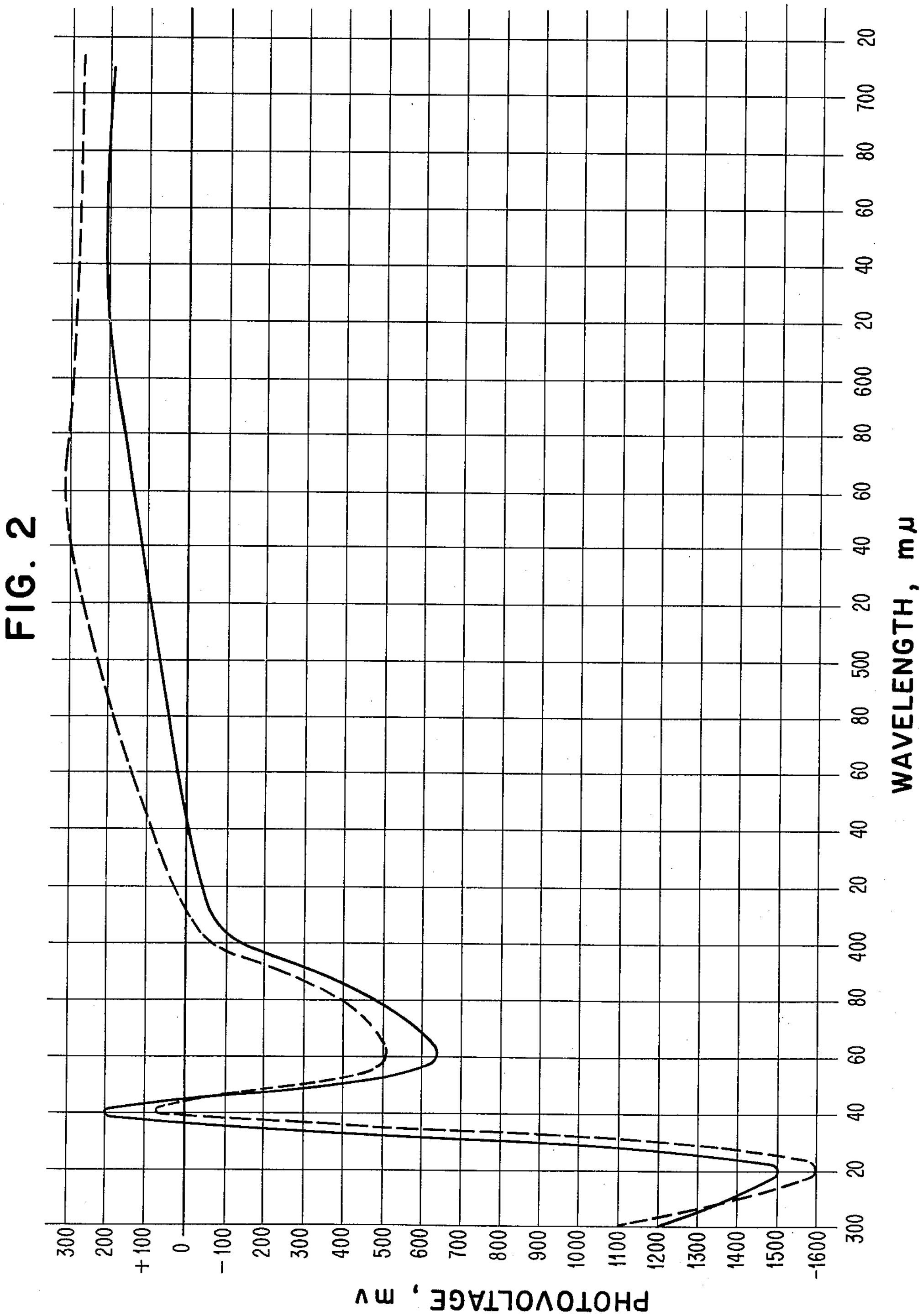
Figure 2 is a plot of photovoltage vs. wavelength for activated hexagonal zinc sulfide single crystals used in the apparatus of Figure 1.

Figure 2 shows the manner in which the photovoltages exhibited by these single crystal materials varies with the angle at which the linearly polarized light strikes the C-axis of hexagonal ZnS activated with small amounts of Cu, Al and Mn. The dependency represented by curve A, solid line, is obtained when the incident light is directed parallel to the C-axis; curve B, dashed line, results when the plane of polarization is directed perpendicular to the same axis. The magnitude of the photovoltage shifts in a linear fashion with changes in angle between these extremes.

The variation of output with wavelength, intensity and angle of incident radiation enables the device to function to indicate the magnitude of any one of these variables, providing the others are kept constant.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A polarization sensitive photovoltaic device comprising hexagonal zinc sulfide single crystal photovoltaic material having a polar axis, electrodes disposed on said single crystal, a light source, a polarizer responsive to said light source to apply linearly polarized light at a given angle with respect to said axis, and a current detector coupled with said electrodes and operable to detect differences in the angle of the light applied to said crystal through said polarizer.

2. A polarization sensitive photovoltaic device comprising hexagonal zinc sulfide activated with Cu, Mn and Al single crystal photovoltaic material having a polar axis, electrodes disposed on said single crystal, a light source, a polarizer responsive to said light source to apply linearly polarized light at a given angle with respect to said axis, and a current detector coupled with said electrodes and operable to detect differences in the angle of the light applied to said crystal through said polarizer.

References Cited in the file of this patent

UNITED STATES PATENTS

| | | |
|---|---|---|
| 1,789,521 | Feingold | Jan. 20, 1931 |
| 2,351,539 | Peck | June 13, 1944 |
| 2,509,068 | McMahon | May 23, 1950 |
| 2,668,867 | Ekstein | Feb. 9, 1954 |

OTHER REFERENCES

Lange: Photo Effects in Semiconductor, "Transactions of the Electrochemical Society," volume 63, 1933, pages 51–63, pages 51–63 relied upon.